United States Patent
Tang

(10) Patent No.: US 10,432,212 B2
(45) Date of Patent: *Oct. 1, 2019

(54) SUCCESSIVE-APPROXIMATION REGISTER (SAR) ANALOG-TO-DIGITAL CONVERTER (ADC) WITH ULTRA LOW BURST ERROR RATE

(71) Applicant: MaxLinear, Inc., Carlsbad, CA (US)

(72) Inventor: Yongjian Tang, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/935,567

(22) Filed: Mar. 26, 2018

(65) Prior Publication Data

US 2018/0234106 A1    Aug. 16, 2018

Related U.S. Application Data

(63) Continuation of application No. 15/478,397, filed on Apr. 4, 2017, now Pat. No. 9,929,740, which is a continuation of application No. 15/130,302, filed on Apr. 15, 2016, now Pat. No. 9,614,539.

(60) Provisional application No. 62/148,459, filed on Apr. 16, 2015.

(51) Int. Cl.
| | |
|---|---|
| *H03M 1/38* | (2006.01) |
| *H03M 1/46* | (2006.01) |
| *H03M 1/12* | (2006.01) |
| *H03M 1/00* | (2006.01) |
| *H03M 1/06* | (2006.01) |

(52) U.S. Cl.
CPC .......... *H03M 1/466* (2013.01); *H03M 1/125* (2013.01); *H03M 1/00* (2013.01); *H03M 1/0695* (2013.01); *H03M 1/12* (2013.01)

(58) Field of Classification Search
CPC ......... H03M 1/0695; H03M 1/12; H03M 1/00
USPC ....................................... 341/161, 120, 155
See application file for complete search history.

(56) References Cited

U.S. PATENT DOCUMENTS

| | | | |
|---|---|---|---|
| 9,124,291 B2 | 9/2015 | Chen et al. | |
| 9,614,539 B2 | 4/2017 | Tang | |
| 9,929,740 B2 * | 3/2018 | Tang | ..................... H03M 1/125 |

\* cited by examiner

*Primary Examiner* — Joseph J Lauture
(74) *Attorney, Agent, or Firm* — McAndrews, Held & Malloy, Ltd.

(57) ABSTRACT

Systems and methods are provided for enhanced analog-to-digital conversions, particularly by allowing for an ultra-low burst error rate. Analog-to-digital conversion may be applied to an analog input via one or more conversion cycles; and performance related parameter corresponding to the analog-to-digital conversion may be assessed. A digital output corresponding to the analog input may be generated, with the generating being controlled based on the assessing of the performance related parameter. The controlling may include adjusting at least a portion of the digital output. The assessing may include determining, for at least one conversion cycle, whether a performance related condition, corresponding to the performance related parameter, occurs. The determination may be based on an outcome of a matching search performed for that conversion cycle. The determination that the performance related condition occurs may be made when the matching search fails to settle within a corresponding time period.

20 Claims, 4 Drawing Sheets

US 10,432,212 B2

SUCCESSIVE-APPROXIMATION REGISTER (SAR) ANALOG-TO-DIGITAL CONVERTER (ADC) WITH ULTRA LOW BURST ERROR RATE

CLAIM OF PRIORITY

This patent application is a continuation of U.S. patent application Ser. No. 15/478,397, filed Apr. 4, 2017, which is a continuation of U.S. patent application Ser. No. 15/130, 302, filed Apr. 15, 2016, which makes reference to, claims priority to and claims benefit from each of U.S. Provisional Patent Application Ser. No. 62/148,459, filed Apr. 16, 2015. The above identified application is hereby incorporated herein by reference in its entirety.

TECHNICAL FIELD

Aspects of the present disclosure relate to signal processing. More specifically, various implementations of the present disclosure relate to successive-approximation register (SAR) analog-to-digital converter (ADC) with ultra low burst error rate.

BACKGROUND

Conventional approaches for performing analog-to-digital conversions may be costly, cumbersome, or inefficient—e.g., they may be complex and/or time consuming, require considerable power, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for successive-approximation register (SAR) analog-to-digital converter (ADC) with an ultra-low burst error rate, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
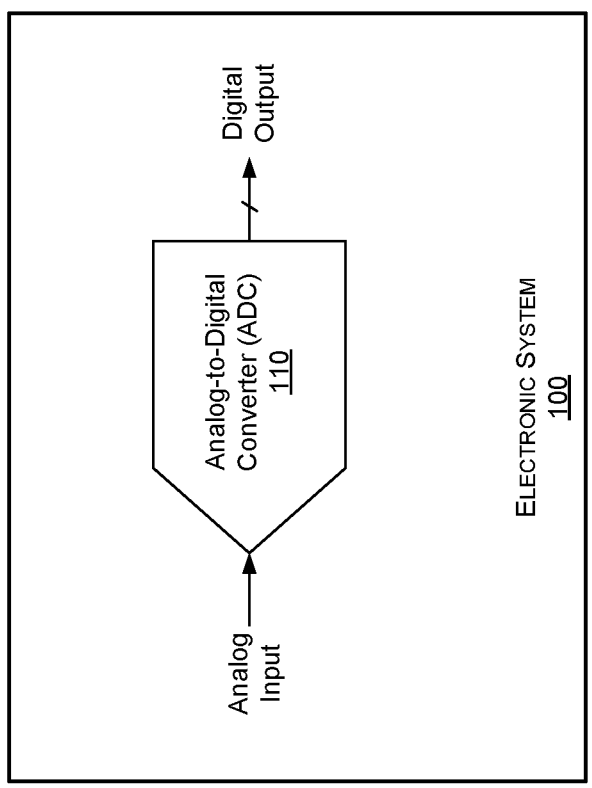
FIG. 1 illustrates an example electronic system that may be operable to perform analog-to-digital conversions.

FIG. 1 illustrates an example electronic system that may be operable to perform digital-to-analog conversions. Shown in FIG. 1 is an electronic system 100.

The electronic system 100 may comprise suitable circuitry for implementing various aspects of the present disclosure. The electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless standards, protocols, and/or interfaces that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+(e.g., GSM/GPRS/EDGE, and IS-95 or cdmaOne) and/or 2G/2G+(e.g., CDMA2000, UMTS, and HSPA); 4G standards, such as WiMAX (IEEE 802.16) and LTE; Ultra-Wideband (UWB), and/or the like.

Examples of wired standards, protocols, and/or interfaces that may be supported and/or used by the electronic system 100 may comprise Ethernet (IEEE 802.3), Fiber Distributed Data Interface (FDDI), Integrated Services Digital Network (ISDN), cable television and/or internet access standards (e.g., ATSC, DVB-C, DOCSIS, etc.), in-home distribution standards such as Multimedia over Coax Alliance (MoCA), and Universal Serial Bus (USB) based interfaces.

Examples of signal processing operations that may be performed by the electronic system 100 may comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to support input/output (I/O) operations, to enable receiving input from and/or providing output to users. Accordingly, the electronic system 100 may comprise components or subsystems for obtaining user input and/or providing output to the user. For example, the electronic system 100 may support input/output (I/O) operations for allowing user interactions which may be needed for controlling the electronic system 100 or operations thereof—e.g., allowing users to provide input or commands, for controlling certain functions or components of the electronic system 100, and/or to output or provide feedback pertaining to functions or components. The electronic system 100 may also support input/output (I/O) operations in conjunction with use of data (e.g., multimedia content). For example, the electronic system 100 may support generating, processing, and/or outputting of video and/or acoustic signals, such as via suitable output devices or components (e.g., displays, loudspeakers, etc.). In this regard, the output signals may be generated based on content, which may be in digital form (e.g., digitally formatted music or the like). Similarly, the electronic system 100 may support capturing and processing of video and/or acoustic signals, such as via suitable input devices or components (e.g., cameras, microphones, etc.), to generate (e.g., to store or communicate) corresponding data. The corresponding data may be in digital form (e.g., digitally formatted music, video, or the like).

The electronic system 100 may be a stationary system (e.g., being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), computers (e.g., laptops, desktops, or servers), dedicated media devices (e.g., televisions, game consoles, or portable media players, etc.), set-top boxes (STBs) or other similar receiver systems, and the like. The disclosure, however, is not limited to any particular type of electronic system.

In operation, the electronic system 100 may be operable to perform various operations, functions, applications and/or services. For example, in some instances, electronic system 100 may be operable to communicate (send and/or receive) data, and to process the communicated data. In this regard, communication of data, whether over wired or wireless interfaces, may typically comprise transmitting and/or receiving signals that are communicated over wireless and/or wired connections. For example, analog radio frequency (RF) signals may be used to carry data (e.g., content), with the data being embedded into the analog signals in accordance with particular analog or digital modulation schemes. For analog communications, data is transferred using continuously varying analog signals, and for digital communications, the analog signals are used to transfer discrete messages in accordance with a particular digitalization scheme. Thus, handling of digital communications (e.g., in the electronic system 100) may typically require performing, among other things, digital-to-analog conversions on the transmitter-end and analog-to-digital conversions at the receiver-end.

Digital-to-analog conversions and/or analog-to-digital conversions may also be performed in the electronic system 100 during other (non-communicative) operations. For example, during audio/video related operations, audio/video content that is typically formatted in digital form may be processed to generate corresponding analog audio or video signals during output operations, and captured audio and/or video analog signals may be processed, to generate the digital audio/video content. That processing may comprise performing digital-to-analog conversions (e.g., during output operations), and/or analog-to-digital conversions (e.g., during input operations).

Accordingly, the electronic system 100 may incorporate suitable components for providing digital-to-analog conversions and/or analog-to-digital conversions. For example, the electronic system 100 may comprise one or more analog-to-digital converters (ADCs) 110. In this regard, each ADC 110 may comprise suitable circuitry for performing analog-to-digital conversions. The ADCs 110 may be utilized, for example, during signal processing, such as to allow converting analog waveforms (e.g., corresponding to received radio frequency (RF) signals, captured acoustic signals, etc.) into corresponding digital representations thereof (e.g., to obtain data carried or embedded therein). The disclosure, however, is not limited to any particular use scenario, and may be utilized in any appropriate setup performing or requiring analog-to-digital conversions.

Various architectures and/or designs may be used for analog-to-digital conversions and/or in implementing corresponding analog-to-digital converters (ADCs). In this regard, various issues and/or considerations may be pertinent to analog-to-digital conversions, and/or to the design and/or implementation of the components (e.g., ADCs) being used to carry such conversions. Analog-to-digital conversions may be complex and/or time consuming, may require considerable power, and/or may introduce errors or distortion. Thus, the various ADC designs or architectures may each be directed to optimizing performance and/or mitigating or eliminating potential issues.

In accordance with the present disclosure, ADCs may be designed and/or implemented based on successive approximation. In this regard, successive approximation analog-to-digital converters (ADCs) may be configured to convert continuous analog waveforms into discrete digital representations based on a binary search through all possible quantization levels before finally converging upon a digital output for each conversion. One example of successive approximation ADCs is the asynchronous successive approximation register (SAR) ADC, which utilizes a register for storing binary values that may be used in the successive approximation search. In this regard, the values stored in the register may be converted to analog signals (via a digital-to-analog convertor (DAC) component), and used in the approximation search (e.g., as quantization values with which received analog signals, or portions thereof, may be matched). For an asynchronous successive approximation register (SAR) analog-to-digital converter (ADC), the time for conversion of each bit/stage may depend on the time the digital-to-analog converter (DAC) component used in it settles and the time the comparator makes a decision. When the input and the threshold (used in matching quantization values) are close, such comparison in the comparator may take a long time. This state in the comparator is called "meta-stability." If the meta-stability state happens and no special actions to take care of it, the ADC will either run out of conversion time before finishing all bit comparisons, or easily causes timing issues in the control logic resulting in errors. This error caused by meta-stability is called burst error in SAR ADCs.

Accordingly, in various implementations in accordance with the present disclosure, ADCs using successive approximation (e.g., SAR ADCs) may be configured to detect and/or handle conditions resulting from meta-stability state in enhanced manner, particularly to improve performance (e.g., with respect to error bursts). Examples of such implementations are described in more detail below.

Figure 2:
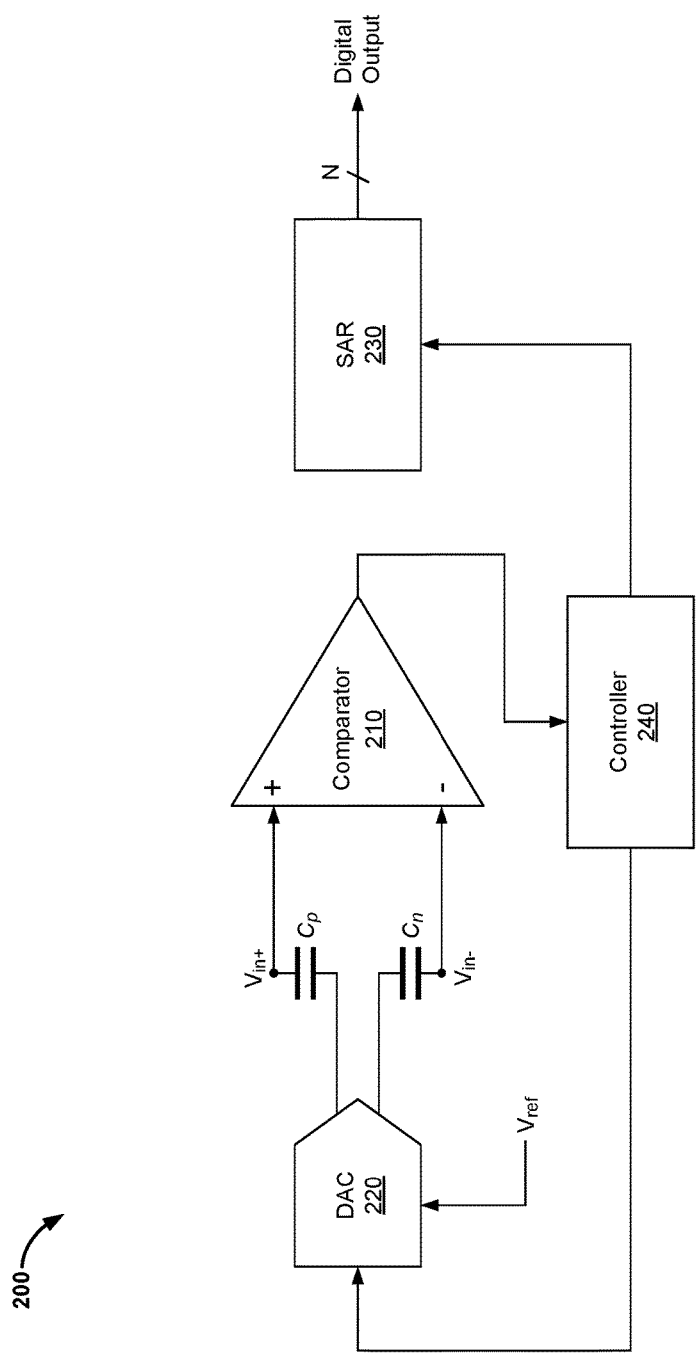
FIG. 2 illustrates an example successive approximation register (SAR) analog-to-digital converter (ADC).

FIG. 2 illustrates an example successive approximation register (SAR) analog-to-digital converter (ADC). Shown in FIG. 2 is a successive approximation register (SAR) analog-to-digital converter (ADC) 200.

The SAR ADC 200 may comprise suitable circuitry for performing analog-to-digital conversions. The SAR ADC 200 may be incorporated into an electronic system (e.g., the electronic system 100 of FIG. 1) to provide analog-to-digital conversions therein—thus, the SAR ADC 200 may correspond to the ADC 110 (or at least a portion thereof). The SAR ADC 200 may be configured to perform analog-to-digital conversions in accordance with successive approximation techniques, wherein continuous analog signals are converted into discrete digital representations based on a binary search, through all possible quantization levels for example, before finally converging upon a digital output for each conversion. For example, the SAR ADC 200 may generate, based on input analog signal(s), a digital output having a particular resolution (e.g., N, with 'N' being a non-zero natural number), that corresponds to the number of bits in the digital output. Commonly, the resolution of SAR ADCs may range from 6 to 16 bits, but the disclosure is not necessarily limited in this regard.

As shown in the example implementation depicted in FIG. 2, the SAR ADC 200 may comprise, a comparator 210, a digital-to-analog convertor (DAC) 220, a successive approximation register (SAR) 230, and a controller 240.

The comparator 210 may comprise circuitry operable to generate one or more output signals based on comparison of input signals (e.g., two input signals). While not particularly shown in FIG. 2, the comparing operations of the comparator 210 may be controlled by use of one or more control signals (e.g., clock signals, reference signals, etc.). For example, comparisons may only be performed based on one or more control signal being asserted or de-asserted (individually or in combination).

The DAC 220 may comprise circuitry for providing an analog voltage equivalent of a particular digital code (e.g., corresponding to output of the controller 240). The DAC 220 may be used in controlling the input signals to the comparator 210. In this regard, the DAC 220 (and its outputs thereof) may be configured to function in accordance with charge scaling techniques, whereby analog voltage corresponding to the output(s) of the DAC 220 may be built up incrementally. For example, each of the outputs of the DAC 220 may be input into two capacitors ($C_P$ and $C_N$). The charge (and thus the analog signal outputted by the DAC 220) may be built up incrementally in the capacitors $C_P$ and $C_N$. This may allow scaling the internal signal compared against the input analog signal (represented as $V_{in}$) incrementally, thus allowing use of DAC 220 (in combination with the capacitors $C_P$ and $C_N$) to provide bit-by-bit sampling (e.g., using a reference signal $V_{ref}$), starting with the most significant bit (MSB), for example.

The SAR 230 may comprise suitable circuitry operable to record and store outcomes of bit-wise comparisons performed in the comparator 210, which may then be provided as a digital output equivalent of the input analog signal. In this regard, the SAR 230 may comprise an N-bit register, with each of these N bits being set to logic high (i.e., '1') or logic low (i.e., '0') based on corresponding output from the comparator 210. For example, during operations, each bit, starting from the MSB may initially be set to logic 2, and then a search may then be done down to the least significant bit (LSB), with each bit being reset to logic 0 when the corresponding output from comparator 210 is a logic low. Once all comparisons are done (i.e., the LSB is reached), the conversion may be complete and the N-bit digital output may be available from the SAR 230.

The controller 240 may comprise suitable circuitry for controlling the operations of the SAR DAC 200, particularly the functions of different components thereof. For example, while not particularly shown in FIG. 2, the controller 240 may be operable to generate control signals (e.g., clocking signals, enable/disable signals, etc.) for controlling operations in the SAR ADC 200. In particular, the controller 240 may generate a digital output which may be provided as input into the DAC 220 to control the overall conversions performed by the SAR ADC 200, by effectively controlling the forwarding of the input voltage $V_{in}$ (corresponding to the analog input) to the comparator 210.

In operation, the SAR ADC 200 may be operable to perform analog-to-digital conversions, and to particularly do so in a successive approximation manner. The SAR ADC 200 may be configured to, for example, convert a continuous analog waveform (corresponding to an analog input signal) into a discrete digital representation based on a binary search through all possible quantization levels before finally converging upon a digital output for each conversion. In an example use scenario, after sampling the input voltage ($V_{in}+$, $V_{in}-$) using the sampling capacitors ($C_P$, $C_N$), the comparator 210 may be used to determine the sign of the differential input voltage—that is, which side of the input voltage is larger. This comparison may be equivalent to comparing the input voltage $V_{in}$ with $V_{ref}/2$. The logic output of the comparator is the first MSB bit. After the decision is made, the comparator 210 may be reset and may wait for the next comparison. Then based on the first MSB bit value (which may be provided via the controller 240 as input into the DAC 220), the $V_{ref}/4$ may be added (when MSB bit is 0) or subtracted (when MSB is 1) from the input voltage via the DAC 220. After summation or subtraction, the comparator 210 may be enabled again, and may compare the inputs (at the + and − sides), and may output the second MSB bit. The operation may be repeated until all bits are generated.

In some instances, however, approximation for a particular stage (e.g., corresponding to particular bit) may introduce errors, such as when meta-stability events occur during an approximation cycle. In a meta-stability event, the comparator (for a particular bit) may not be able to make an decision due to its finite gain, such as when the input analog signal, corresponding to the particular bit, may be too close to the quantization threshold (thus rendering difficult the determination of which side of the input voltage is larger). In other words, the comparator 210 may take too long (e.g., up to the end of the time allocated for each approximation cycle) to approximate the discrete equivalent of a particular bit, the SAR ADC may not have sufficient time to finish all remaining bit generation within given total conversion time, thus resulting in a potential large error at the digital output. This is explained further with reference to FIG. 3.

Figure 3:
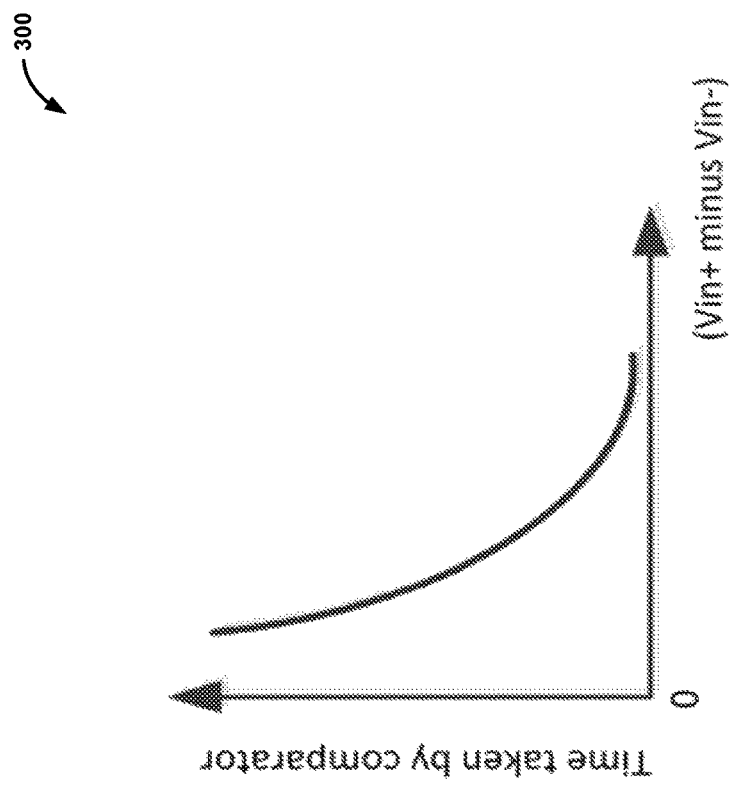
FIG. 3 illustrates an example timing chart for a comparison performed by a comparator in a successive approximation register (SAR) analog-to-digital converter (ADC).

FIG. 3 illustrates an example timing chart for a comparison performed in a successive approximation register (SAR) analog-to-digital converter (ADC). Shown in FIG. 3 is a chart 300 representing a meta-stability profile of a comparator (e.g., the comparator 210 of FIG. 2).

In particular, the chart 300 is a timing chart representing the comparison time (e.g., time that a comparator needs to make an approximation determination) as a function of the differential voltage (difference between the two sides of the input voltage $V_{in}$). In this regard, as depicted in chart 300, the time for the comparator (e.g., comparator 210) to make a decision is exponentially inverse-proportional to its input difference (e.g., $V_{in}+$ minus $V_{in}-$). The time may become extremely long when the differential voltage (that is, the input difference) approaches zero, resulting in a meta-stability state, where the comparator would not be able to produce a solid decision within a certain given time (e.g., the time allocated for the approximation stage—that is, the time to approximate the corresponding bit in the N-bit output sequence). If the time for the comparator to make a decision is too long, the SAR ADC (SAR ADC 200) may not finish all bit conversions within a given conversion time. While the meta-stability state may not happen frequently, when it happens it may generate large burst errors. Therefore, the meta-stability state of the comparator should be detected in order to avoid large burst errors. Accordingly, in various implementations in accordance with the present disclosure, SAR DACs may be implemented with adaptive control for detecting and handling meta-stability events. An example implementation is described in more detail with respect to FIG. 4.

Figure 4:
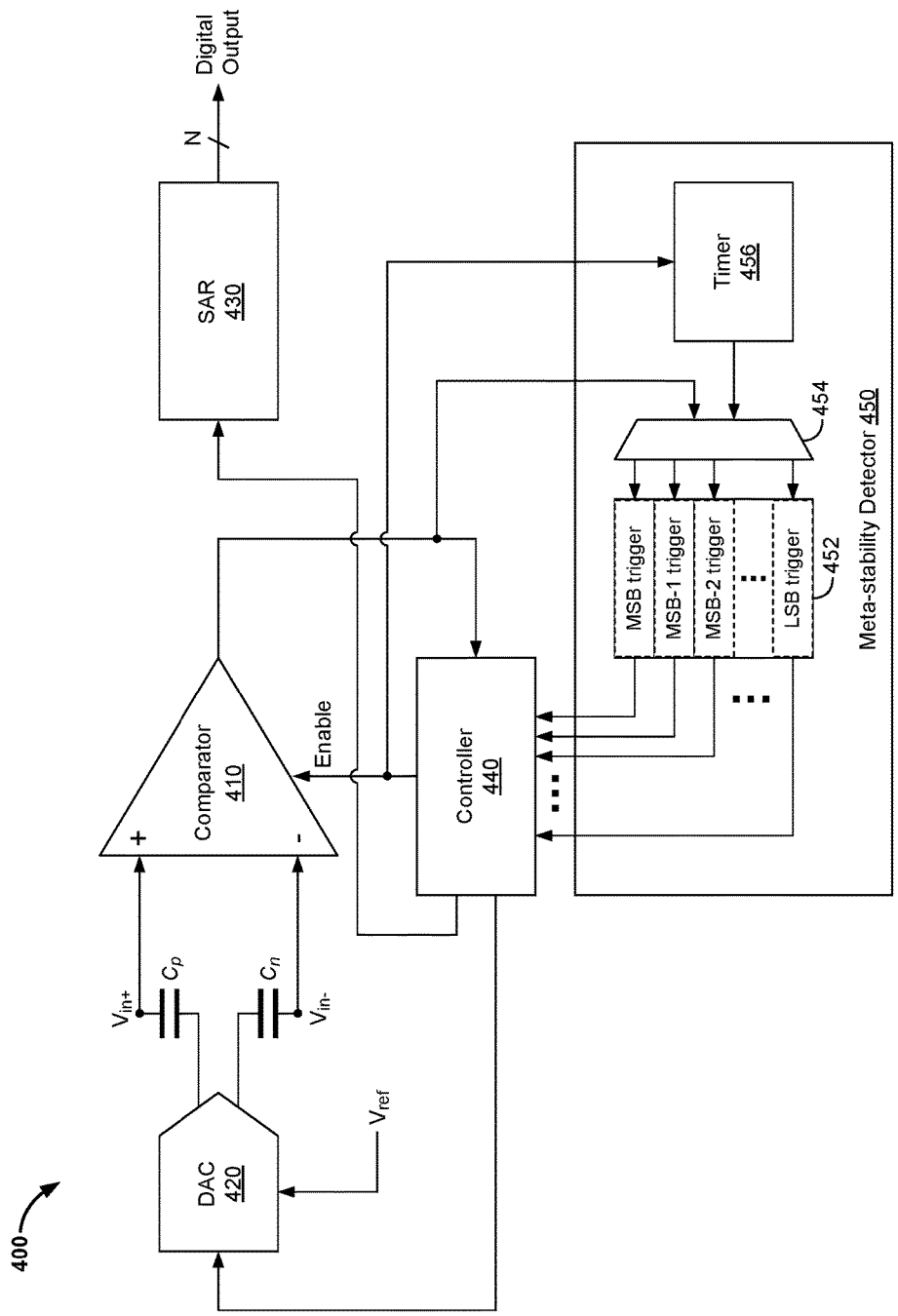
FIG. 4 illustrates an example successive approximation register (SAR) analog-to-digital converter (ADC) with support for an ultra-low burst error rate, in accordance with the present disclosure.

FIG. 4 illustrates an example successive approximation register (SAR) analog-to-digital converter (ADC) with support for an ultra-low burst error rate, in accordance with the present disclosure. Shown in FIG. 4 is a successive approximation register (SAR) analog-to-digital converter (ADC) 400.

The SAR ADC 400 may be substantially similar to the SAR ADC 200 of FIG. 2, for example. In this regard, the SAR ADC 400 may comprise suitable circuitry for performing analog-to-digital conversions, particularly in accordance with successive approximation techniques. The SAR ADC 400 may be operable to, however, support ultra-low burst error rates. For example, the SAR ADC 400 may comprise suitable circuitry for detecting when meta-stability occurs (or may occur), and for taking measures to account for and/or mitigating the effects of detected meta-stability events, to ensure the bits corresponding to approximation cycles that follow the cycle where the meta-stability event is detected are still set (or approximated) accurately.

In the example implementation depicted in FIG. 4, the SAR ADC 400 may comprise, a comparator 410, a digital-to-analog convertor (DAC) 420, a successive approximation register (SAR) 430, a controller 440, and a meta-stability detector (MSD) 450. In this regard, each of the comparator 410, the DAC 420, the SAR 430, and the controller 440 may be similar to the corresponding components of the SAR ADC 200 (e.g., the comparator 210, the DAC 220, the SAR 230, and the controller 240, respectively), and may operate in substantially similar manner.

The MSD 450 may comprise suitable circuitry for detecting and handling meta-stability events in the SAR ADC 400. For example, the MSD 450 may be configured to detect meta-stability events in a time-based manner (e.g., based on a timer to ensure that each approximation cycle is only allowed to last a particular time so that all bit approximation can be finished), and to handle meta-stability events per-cycle (or per-bit with respect to the bit-sequence being generated for output). In the example implementation shown in FIG. 4, the MSD 450 may comprise, for example, a bit-trigger block 452, a multiplexer (Mux) block 454, and timer block 456.

The bit-trigger block 452 may comprise suitable circuitry for triggering setting of bits during approximation cycles, particularly on a per-bit basis. In this regard, the bit-trigger block 452 may comprise a plurality of individual bit-triggers that may be used in triggering each of the bits of the output bit-sequence (e.g., MSB-trigger through LSB-trigger). The bit-triggers may be implemented, for example, as flip-flops (e.g., D flip-flops).

The Mux block 454 may comprise suitable circuitry for setting one of a plurality of outputs (e.g., each corresponding to one of the bit-triggers, MSB-trigger through LSB-trigger, in the bit-trigger block 452) based on an input to the Mux block 454. For example, the Mux block 454 may have two inputs, one input corresponding to the output of the comparator 410 (representing the outcome of comparison for a particular cycle) and a second input corresponding to an output from the timer block 456.

The timer block 456 may comprise suitable circuitry for running timers, and (optionally) for taking specific actions based on the run timers (e.g., timer expiry). For example, the timer block 456 may comprise (or be configured to run) as a meta-stability timer when a control signal is asserted. In this regard, to ensure that the meta-stability timer is started at the right time, the same control signal (e.g., enable signal) is asserted to enable the comparator 410 to initiate a comparison operation for a particular approximation cycle.

Accordingly, when the meta-stability timer expires before a successful resolution of the comparison, a corresponding action may be taken. For example, when a timer expiry event occurs, output of the timer block 456 may be generated (or set) accordingly, to a particular pre-defined value, and fed into the Mux block 454. Further, the Mux block 454 may be configured such that when such timer expiry occurs, both the output of the timer block 456 and the output of the comparator 410 are routed to the corresponding bit-trigger (e.g., the bit-trigger corresponding to the bit that is being approximated when the meta-stability state occurred). The corresponding bit-trigger will use the timer 456 output to check whether the comparator 410 has made a solid decision or not.

In operation, the SAR ADC 400 may operate in a substantially similar manner as the SAR ADC 200, as described with respect to FIG. 2, for example. The SAR ADC 400 may be configured, however, to detect and handle meta-stability events in an improved manner, particularly to reduce the possibility of burst errors caused by meta-stability events.

In an example use scenario, the MSD 450 may be used to detect and handle meta-stability events on per-conversion cycle basis. In this regard, a meta-stability state may be detected by using a bit-trigger (e.g., corresponding to one of the bit-triggers, MSB-trigger through LSB-trigger, in the bit-trigger block 452), to check, for each conversion cycle (bit in the input), whether the comparator 410 makes a solid decision at the time of a fixed delay after the comparator 410 is enabled (e.g., by the controller 440) to perform a comparison for a particular approximation cycle. The fixed delay may be produced by the timer block 456.

As the output of the comparator 410 may change at the same time when the timer block 456 is up, the bit-trigger itself may also go into a meta-stability state since the bit-trigger is fundamentally another comparator. This meta-stability is generally not avoidable due to the undefined timing relationship between the comparator 410 and the timer block 456. Therefore, the output of the bit-trigger is not always guaranteed to be reliable, and this information should only be used at the end of conversion time (when this information has to be used to generate the final digital output). In other words, any use of the information before the end of conversion time may be undesirable. Conventional meta-stability detector reuse single trigger for all bits, thus the time left for the trigger to detect a meta-stability event may be very short. If this single trigger cannot detect the meta-stability state in that short time or points to a wrong bit (e.g., not where the meta-stability event actually occurred), a large burst error will be generated. Therefore, having a dedicated trigger for each one of the bit conversions (e.g., bit-triggers for each of the MSB through LSB conversions) resolves that issue by ensuring sufficient time for the trigger to regenerate, i.e. make decisions. As can be seen, the MSB meta-stability bit-trigger has the longest time to make decisions (from the beginning of MSB conversion to the end of all bits' conversion time), so the possibility of the MSB trigger going wrong is ultra low. The error rate of other LSB triggers increases as compared to the MSB, but their bit weight in the digital output are also lower. For example, by doing this, the burst error rate can be reduced by several of orders—e.g., by 10^5 in a 12-bit SAD ADC design.

Thus, in accordance with the present disclosure, meta-stability in the comparator may be handled in an enhanced manner in analog-to-digital convertors (ADCs) by providing meta-stability detection for every bit conversion. This may be done by using the timer to check whether the comparator makes a solid decision or not. This meta-stability detector itself may also have meta-stability issue due to undefined timing relationship between the timer and the comparator. An enhanced manner may be taken to reduce the possibility of this second meta-stability issue. This may be done by using a dedicated meta-stability detector for each bit and only use its information after all bits are converted. Any usage of this information before the end of all conversions is bad ideas.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
applying analog-to-digital conversion to an analog input via one or more conversion cycles;
assessing a performance related parameter corresponding to said analog-to-digital conversion, said assessing comprising:
determining, for at least one conversion cycle, whether a performance related condition, corresponding to said performance related parameter, occurred, based on an outcome of a matching search performed for that conversion cycle; and
controlling generating a digital output corresponding to said analog input based on said assessing of said performance related parameter.

2. The method of claim 1, comprising assessing said outcome of said matching search after triggering of a next conversion cycle.

3. The method of claim 1, comprising triggering at least one conversion cycle based on a cycle termination event associated with a prior conversion cycle.

4. The method of claim 3, wherein said cycle termination event comprises expiry of a corresponding fixed delay.

5. The method of claim 1, wherein said controlling of generating of said digital output comprises adjusting at least a portion of said digital output.

6. The method of claim 5, comprising determining said portion of said digital output based on said assessing of said performance related parameter.

7. The method of claim 1, comprising determining that said performance related condition occurred when said matching search fails to settle within a corresponding time period.

8. The method of claim 1, comprising detecting said performance related condition for each one of said one or more conversion cycles.

9. The method of claim 8, comprising:
generating information relating to a result of said detecting of said performance related condition during each conversion cycle; and
retaining said information until end of said analog-to-digital conversion.

10. The method of claim 9, assessing said performance related parameter based on said retained information.

11. A system, comprising:
one or more conversion circuits that apply analog-to-digital conversion to an analog input via a one or more conversion cycles;
one or more detection circuits that assess a performance related parameter corresponding to said analog-to-digital conversion, said assessing comprising:
determining, for at least one conversion cycle, whether a performance related condition, corresponding to said performance related parameter, occurred, based on an outcome of a matching search performed for that conversion cycle; and
one or more control circuits that control generating a digital output corresponding to said analog input based on said assessing of said performance related parameter.

12. The system of claim 11, one or more detection circuits that assess said outcome of said matching search after triggering of a next conversion cycle.

13. The system of claim 11, wherein said one or more conversion circuits trigger at least one conversion cycle based on a cycle termination event associated with a prior conversion cycle.

14. The system of claim 13, wherein said one or more conversion circuits trigger said at least one conversion cycle based on expiry of a corresponding fixed delay.

15. The system of claim 11, wherein said one or more control circuits adjust at least a portion of said digital output.

16. The system of claim 15, wherein said one or more control circuits determine said portion of said digital output based on said assessing of said performance related parameter.

17. The system of claim 11, wherein said one or more detection circuits determine that said performance related condition occurred when said matching search fails to settle within a corresponding time period.

18. The system of claim 11, wherein said one or more detection circuits detect for occurrence of said performance related condition for each one of said one or more conversion cycles.

19. The system of claim 18, wherein said one or more detection circuits:
generate information relating to a result of said detecting of said performance related condition during each conversion cycle; and
retain said information until end of said analog-to-digital conversion.

20. The system of claim 19, wherein said one or more detection circuits assess said performance related parameter based on said retained information.

* * * * *